US006597374B1

(12) United States Patent
Baker et al.

(10) Patent No.: US 6,597,374 B1
(45) Date of Patent: Jul. 22, 2003

(54) ACTIVITY BASED REMOTE CONTROL UNIT

(75) Inventors: Karen L. Baker, Kirkland, WA (US); Russell I. Sanchez, Seattle, WA (US); Chris E. Tobey, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/191,288

(22) Filed: Nov. 12, 1998

(51) Int. Cl.[7] .................................................. G06F 3/00
(52) U.S. Cl. ........................ 345/717; 345/740; 345/173; 348/734
(58) Field of Search ................................ 348/563, 569, 348/734; 700/83

(56) References Cited

U.S. PATENT DOCUMENTS

| | | | | |
|---|---|---|---|---|
| 4,712,105 A | * | 12/1987 | Kohler | 340/825.69 |
| 4,774,511 A | | 9/1988 | Rumbolt et al. | 340/825.69 |
| 4,825,200 A | | 4/1989 | Evans et al. | 341/23 |
| 4,833,592 A | | 5/1989 | Yamanaka | 700/9 |
| 4,866,434 A | | 9/1989 | Keenan | 340/825.72 |
| 5,086,385 A | * | 2/1992 | Launey et al. | 700/83 |
| 5,228,077 A | | 7/1993 | Darbee | 379/102.01 |
| 5,237,327 A | | 8/1993 | Saitoh et al. | 341/176 |
| 5,327,160 A | * | 7/1994 | Asher | 345/156 |
| 5,386,251 A | | 1/1995 | Movshovich | 348/734 |
| 5,410,326 A | | 4/1995 | Goldstein | 348/734 |
| 5,455,570 A | | 10/1995 | Cook et al. | 340/825.22 |
| 5,457,478 A | * | 10/1995 | Frank | 345/158 |
| 5,488,571 A | | 1/1996 | Jacobs et al. | 708/111 |
| 5,490,209 A | | 2/1996 | Kennedy et al. | 379/93.08 |
| 5,515,052 A | | 5/1996 | Darbee | 341/176 |
| 5,535,147 A | | 7/1996 | Jacobs et al. | 708/111 |
| 5,543,857 A | * | 8/1996 | Wehmeyer et al. | 348/589 |
| 5,545,857 A | | 8/1996 | Lee et al. | 178/18.03 |
| 5,570,297 A | | 10/1996 | Brzezinkski et al. | 358/1.13 |
| 5,590,192 A | | 12/1996 | Lovett et al. | 705/51 |
| 5,594,462 A | | 1/1997 | Fishman et al. | 345/2 |
| 5,598,523 A | * | 1/1997 | Fujita | 345/352 |
| 5,619,191 A | | 4/1997 | Lambropoulos et al. | 340/825.69 |
| 5,629,868 A | | 5/1997 | Tessier et al. | 348/164 |
| 5,650,774 A | | 7/1997 | Drori | 340/825.32 |
| 5,652,602 A | | 7/1997 | Fishman et al. | 345/156 |
| 5,657,078 A | | 8/1997 | Saito et al. | 348/180 |
| 5,689,663 A | * | 11/1997 | Williams | 345/327 |
| 5,705,997 A | | 1/1998 | Park | 340/825.49 |
| 5,710,605 A | | 1/1998 | Nelson | 348/734 |
| 5,748,895 A | | 5/1998 | Shiff et al. | 713/300 |
| 5,764,179 A | | 6/1998 | Tsurumoto | 341/176 |
| 5,874,906 A | | 2/1999 | Willner et al. | 341/22 |
| 5,936,611 A | * | 8/1999 | Yoshida | 345/158 |
| 6,008,735 A | | 12/1999 | Chiloyan et al. | 340/825.22 |
| 6,020,881 A | * | 2/2000 | Naughton et al. | 345/327 |
| 6,127,961 A | * | 10/2000 | Stacy et al. | 341/176 |
| 6,208,341 B1 | * | 3/2001 | Van Ee et al. | 345/339 |
| 6,211,870 B1 | * | 4/2001 | Foster | 345/333 |

OTHER PUBLICATIONS

Brochure: Take Control—The Lexicon 500T System Controller, Lexicon, 1994, 4 pages.

Daniel Long, "The Lexicon 500T System Controller", Secrets of Home Theater and High Fidelity, Issue No. 2, 1996, 2 pages.

Gareth Branwyn, ROTEL RR990 Universal Remote, www-.streettec.com, Jan. 2, 1998, 3 pages.

Marantz RC2000 MKII, www.Marantzamerica.Com/re-2000.htm, –Apr.98–, 2 pages.

* cited by examiner

*Primary Examiner*—Crescelle N. dela Torre
(74) *Attorney, Agent, or Firm*—Westman, Champlin & Kelly, P.A.; S. Koehler

(57) ABSTRACT

A remote control for controlling a plurality of controllable devices includes a processor, a display screen coupled to the processor, and memory coupled to the processor. The memory includes a program module to solicit information from a user regarding operation of the plurality of controllable devices to perform an activity.

13 Claims, 10 Drawing Sheets

ACTIVITY BASED REMOTE CONTROL UNIT

BACKGROUND OF THE INVENTION

The present invention relates generally to remote control units and, more particularly, an activity based remote control unit for controlling a plurality of controllable devices.

Remote control units, such as for televisions, have been available to consumers for many years. Commonly, these control units operate by generating an infrared (IR) beam of light with controlled parameters that can transfer a plurality of commands. For instance, the remote control unit ("remote control" or "remote") can be used to either power up/down the controllable device, raise or lower the volume of a receiver, change channels, as well as provide other commands suitable for the device being controlled.

As the number of electronic devices has increased in the home, for example, through the addition of video recording devices, cable television converters and stereophonic equipment, so too has the number of remote control units used to control all of the individual components. Each component is selfcontained in that it can be controlled independently, although it may well be connected to other components. As such, each manufacturer commonly provides a separate remote for each component. Therefore, it is common for the user to have many remotes, each remote being designed to control a particular component.

Recognizing that the proliferation of remote control units is a problem for many users, there has been much development in providing a universal remote control unit. Unfortunately, only limited success has been obtained. Commonly, the universal remote is quite large and includes a multitude of buttons arranged in some manner for each of the possible devices that it will control. Usually, the buttons are grouped according to component. For instance, those buttons used for controlling a video cassette recorder (VCR) are located on a first portion of the top panel, whereas buttons for a compact disk player or television are located on other portions of the top panel. Many users find such a large device to be overwhelming and complex to operate. In addition, the universal remote control is often incomplete in that it only has buttons to replace certain functions of the manufacture's remote control. Thus, the user must keep both the universal remote control and the device specific remote handy to control the device.

Since a universal remote control is designed to work with many different components or controllable devices, it is often necessary to program the universal remote control to operate each of the user's specific controllable devices. Typically, a universal remote control will store or otherwise be associated with a code set for each controllable device that it controls. A code set is a group of commands that operate a controllable device. The code sets commonly vary for each type and brand of controllable device. For example, the code set that controls a first brand of television is most likely different than a code set that controls a second brand of television. Furthermore, it is common for a manufacturer to have multiple code sets, which only complicates the setup process. In one mode of programming, the user is required to look in an instruction manual to identify the proper code set (from a large number of possible code sets) for each device to be. controlled. Perusing an instruction manual to identify the correct code set for many different types and brands of devices is time-consuming and interjects a high probability of error to the setup process.

In a second mode of programming, the universal remote control "learns" which IR signal should be sent to control each aspect of the controllable device. Typically, the user is instructed to position the universal remote control to receive IR signals from the device manufacturer's remote control. The user is then required to follow a tedious programming method in which the user presses buttons on the source remote and then on the universal remote, in an attempt to have the universal remote learn which IR signals need to be sent or transmitted for each function.

Although there also exist some high-end systems that use touch-sensitive panels and graphical displays to provide a universal remote control with programmed graphical icons that the user can operate, such systems are expensive and must be programmed by a professional installer.

Accordingly, there is a need for an inexpensive, easy to use, universal remote control that a user can operate without the need for a multitude of buttons for each device. In addition, the universal remote control should be easy to program.

SUMMARY OF THE INVENTION

A remote control for controlling a plurality of controllable devices includes a processor, a display screen coupled to the processor, and memory coupled to the processor. The memory includes a program module to solicit information from a user regarding operation of the plurality of controllable devices to perform an activity.

Another aspect of the present invention includes a computer-readable medium on which is stored a program module for operation of a remote control. The remote control controls a plurality of controllable devices and includes a processor coupled to a display screen. The program module comprises instructions which, when executed by the processor, performs the steps comprising: soliciting information regarding operation of the plurality of controllable devices to perform an activity; and generating a screen displayable on the display screen for the activity, the screen including indicators for controlling at least one of the plurality of controllable devices.

Another aspect of the present invention is a remote control for controlling a controllable device. The remote control includes a processor and a display screen coupled to the processor. A transmitter is coupled to the processor to transmitter is coupled to the processor to transmit command signals to the controllable device. Buttons (soft and/or hard) are coupled to the processor for initiating selected command signals to be transmitted. A receiver is coupled to the processor to receive command signals from a source remote. The remote control further includes memory for storing a program module. The program module generates prompts on the display screen for a user to transmit selected command signals to the receiver. The program module also associates received command signals with the buttons for initiating selected command signals to be transmitted.

Another aspect of the present invention is a computer-readable medium on which is stored a program module for operation of a remote control having a processor, a display screen, a transmitter, buttons to initiate the transmitter and a receiver. The program module comprises instructions which, when executed by the processor, perform the steps comprising: generating prompts on the display screen for a user to transmit selected command signals to the receiver; and associating received command signals with the buttons for initiating selected command signals to be transmitted.

DETAILED DESCRIPTION OF THE PREFERRED EMBODIMENTS

Figure 1:
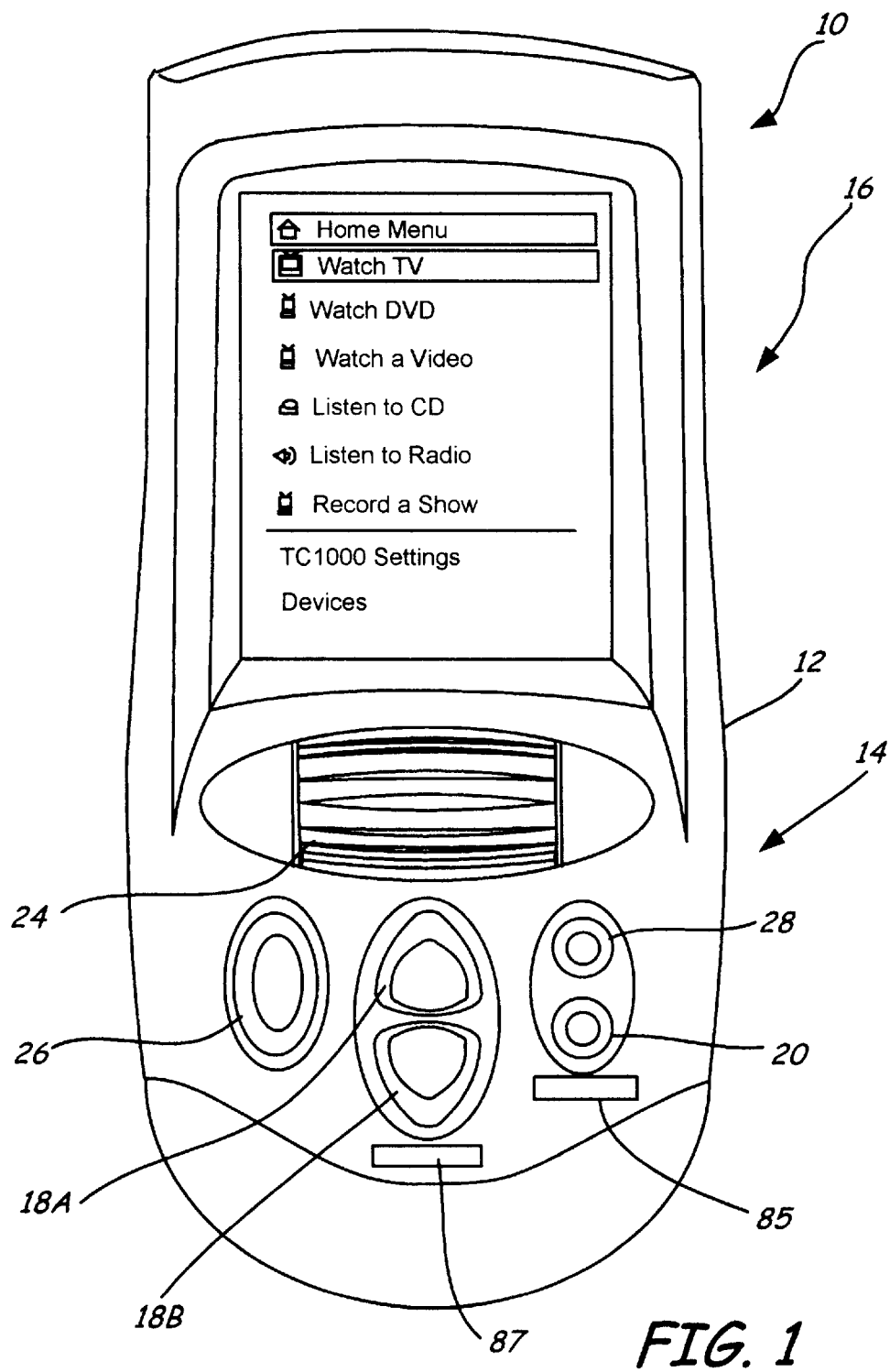
FIG. 1 is a top plan view of an exemplary remote control unit of the present invention.

A top plan view of an exemplary remote control unit 10 of the present invention is illustrated in FIG. 1. The remote control 10 includes a housing 12 and a user interface that includes a keypad 14 and a display 16 disposed on the top of the housing 12. In the embodiment illustrated, the keypad 14 comprises buttons 18A and 18B that function as paired opposites that are usually used to control the volume of a controllable device. In addition, the keypad 14 includes a "mute" button 20 that can be conventionally used to mute or reinstate the sound. for the controllable device. A rotating wheel 24 allows the user to highlight desired selections on the display 16, or change channels, radio stations and/or tracks on a compact disc. Preferably, the rotating wheel 24 is depressible so that upon highlighting the desired selection, the user can depress the rotating wheel 24 slightly into the housing 12 in order to select the highlighted selection. As will be explained below, navigation of information displayed on the remote control 10 is done with hierarchical .menus, enabling the user to move through a tree structure. In the embodiment illustrated, a "home" button 26 is provided to allow the user to quickly return to the highest or "root" menu.

The display 16 is preferably a liquid crystal display (LCD), which in the embodiment illustrated comprises a matrix of 200×160 pixels, 2-bit (white, light gray, dark gray and black), incorporated with a touch-sensitive screen. As described below, the display 16 displays "soft" buttons or indicators, which when engaged, as sensed through the touch-sensitive screen, can be used to control the controllable device. A backlight button 28 allows the user to illuminate the display 16 in low light conditions.

It should be understood that the present invention is not limited to the configuration of the face of the remote control unit 10 illustrated in FIG. 1, or to any other specific configuration.

Figure 2:
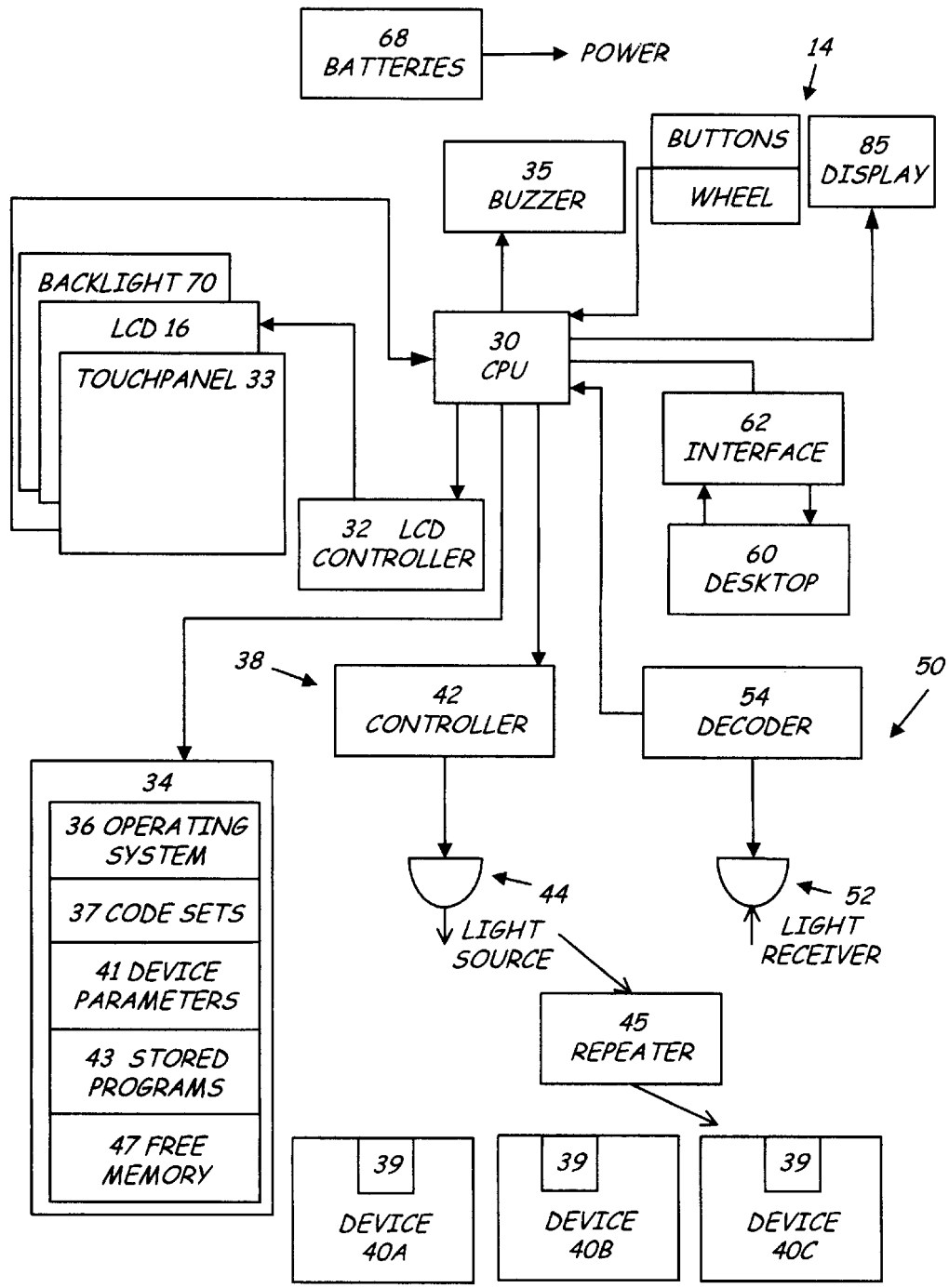
FIG. 2 is a block diagram of the exemplary embodiment.

FIG. 2 illustrates functional components of the exemplary remote control 10. A central processing unit (CPU) 30 implements the software controlled functions of the remote control 10. In one embodiment, the CPU 30 is a 16-bit processor although it will be understood that CPUs employing either more or fewer bits during processing can alternatively be used. The CPU 30 is coupled to a LCD controller 32 that in turn is coupled to the display 16. The CPU 30 provides signals to the LCD controller 32 so that text and graphic icons can be generated on the display 16 in accordance with controlling software being executed. A touch sensitive panel 33 provides signals to the CPU 30 as a function of activation. A buzzer 35 provides audio feedback.

Memory 34 is also coupled to the CPU 30. In the embodiment illustrated, the memory 34 stores an operating system software 36 that controls the basic functionality of the remote control 10, e.g., interaction of the user with the keypad 14 and the display 16, and other operating system kernel functions, e.g., the loading and execution program modules, such as a setup program module. The memory 34 also stores a database of code sets 37 associated with various types and brands of devices, device parameters 41 such as the time, stored programs 43 and free memory 47 used for temporary data storage during program execution. The memory 34 can be implemented as a combination of read/write memory, such as static random access memory (SRAM), and read-only memory, such as electrically programmable read only memory (EPROM).

A transmitter 38, connected to the CPU 30, transmits signals from the remote control unit 10 to a receiver 39 of a controllable device 40A. Other controllable devices that can be controlled by the remote control unit 10 are illustrated as devices 40B and 40C. Each of the controllable devices 40B and 40C also include a receiver 39. In the embodiment illustrated, the transmitter 38 is an infrared transmitter having a controller 42 and an infrared transmitting light source 44. The controller 42 controls operation of the light source 44 in a manner well known to those skilled in the art to encode commands for the controllable devices 40A–40C. Each receiver 39 of the controllable devices 40A–40C receives the transmitted infrared signals; however, only the intended controllable device 40A–40C responds to the encoded transmitted signal to perform the required action. Although illustrated with an infrared transmitter, it should be understood that aspects of the present invention can be implemented with other types of transmitters such as radio transmitters that transmit analog and/or digital signals. Furthermore, a repeater 45 can be used anywhere in the transmission path from the remote control unit 10 to the controllable device 39B to transmit command signals. The repeater 45 is commonly used in applications where walls, doors or other objects prevent direct transmission of the command signals to the controllable device 39B.

It should also be understood that the controllable devices 40A–40C can be any number of various brands, models or types of devices that can be controlled by the remote control unit 10. Some examples include televisions, video cassette recorders, cable converters, compact disk players, audio tuners, audio cassette players, satellite tuners, laser disc players, lights, security devices, appliances, etc.

In a further embodiment, the remote control unit 10 can receive information in addition to transmitting command signals. In a manner described below, the remote control unit 10 can learn encoded IR command signals transmitted from other device specific remote control units. A receiver 50 receives the command signals to be learned. In the embodiment illustrated, the receiver 50 includes an infrared sensing element 52 coupled to a decoder 54. The infrared sensing element 52 receives the transmitted IR command signals, providing a corresponding output signal to the decoder 54. The decoder 54 decodes the output signal for use by the CPU 30.

In yet a further embodiment, the remote control unit 10 can communicate with a remote computer 60, such a desktop personal computer. An interface 62 couples the remote control unit 10 to the computer 60 in order to allow data, such as additional code sets, to be downloaded from the computer 60 and stored in the memory 34 of the remote control unit 10. If desired, advanced programming for the remote control unit 10 can be performed on the computer 60, and then subsequently downloaded using the interface 62. In addition, settings, programming and/or IR codes of the remote control unit 10 can be stored on the remote computer 60 in the event the remote control unit 10 is lost or stolen. In one embodiment, the interface 62 comprises a serial link. However, as appreciated by those skilled in the art, any other communication link commonly used between computers can also be implemented.

Power is provided by batteries 68 to each of the above-described components of the remote control unit 10 and a backlight 70 that illuminates the display In another embodiment, power can be provided from household AC current. Preferably, at least a portion of the memory 34 will retain data in the event of power loss.

Figure 3:
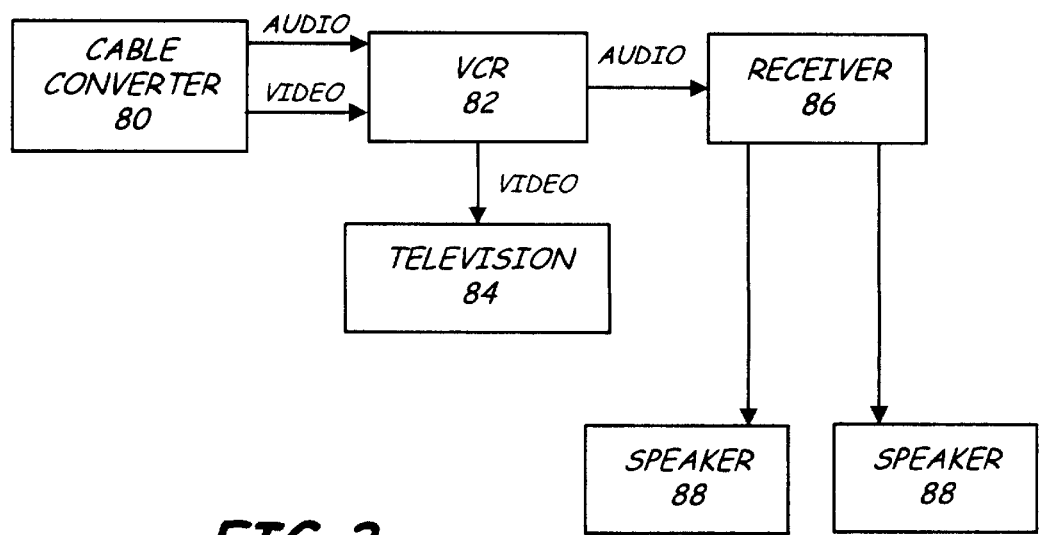
FIG. 3 is a block diagram of an exemplary configuration of controllable devices.

As indicated above, navigation on the remote control unit 10 is done with hierarchical menus, enabling the user to move through a tree structure. FIG. 1 illustrates a screen display of the "Home Menu". The "Home Menu", like all other menus, includes a title bar located at the top of the display 16, giving the name of the menu, and, in the embodiment illustrated, the current time. An aspect of the present invention is the use of "Activities" or "Activity Modes". Activity Modes are based on user activities rather than specific devices in use. For example, "Watch TV" is an activity that could require the use of the user's television, VCR, cable converter and receiver, depending on the types of components and user's configuration of these devices. Referring to FIG. 3, the audio and video signal can originate, for example, at a cable converter 80 and be provided to a VCR 82. The VCR 82 is used for channel selection, wherein the video signal is provided to a television 84. However, the audio signal is provided to a receiver 86 that in turn is provided to speakers 88. Thus, the receiver 86 controls the sound volume. In thus manner, the remote control unit 10 transmits command signals to the VCR to change channels and transmitters command signals to the receiver 86 during the activity of watching television.

Figure 4:
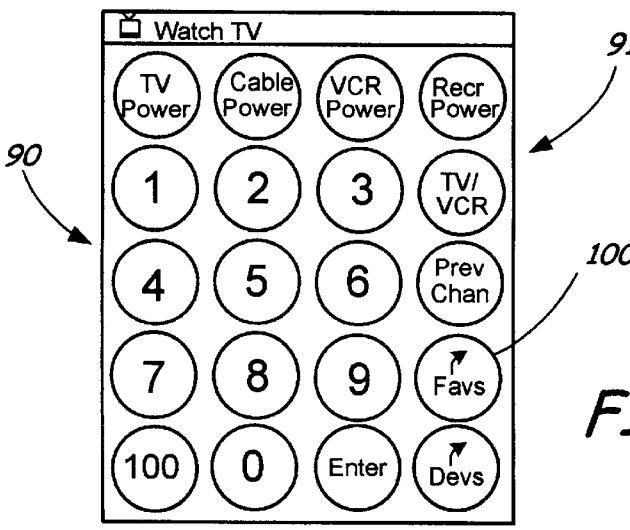
FIG. 4 is a screen display of an exemplary activity mode.

FIG. 4 is a screen display for the activity "Watch TV". In this example, the buttons 18A. and 18B are mapped to the receiver 86 to control volume, while the mute button 20 can be mapped to the receiver 86 or the VCR 82, depending on the capabilities of these devices. Soft buttons 90 forming the numeric keypad on the displayed screen of FIG. 4 would be mapped to the VCR 82 to allow channel selection. All power buttons 90 for the devices of this activity (television, cable converter, VCR and receivers are also displayed on the display 16 to allow the user to selectively turn on/off each device. Additional soft buttons can be provided, as appropriate, based on the activity selected. In this manner, the user is not overwhelmed with buttons that are not needed to perform the activity, but rather, is presented with only those buttons that the user may need to perform the activity. This makes the remote control unit 10 easier to understand and operate.

It should be noted that the mute button 20 can be mapped to control functions based on the activity in use. For example, the mute button 20 can control audio on a television or receiver during an activity such as "Watch TV" or "Listen To Radio"; however, for an activity such as "Watch VCR" or "Listen To CD", the mute button 20 can be mapped to provide a "pause" control signal which may be more appropriate, given that activity.

In a further embodiment as illustrated in FIG. 1, a small display 85, such as an LCD display, can be disposed adjacent button 20. CPU 30 (FIG. 2) is operatively connected to display 85 and provides suitable control signals to display 85 to cause display 85 to render an icon or other label that conveys to the user the current function of the button 20. For example, when the button 20 functions as a "mute" button, the display 85 can render "mute" to the user. Whereas, when the button 20 functions as a "pause" button, the display 85 can render "pause" to the user. The renderings on the display 85 are adjusted as a function of mapping of the button 20 for specific uses based on the current activity.

Similarly, displays can be associated with buttons 18A, 18B, 26 and 28, and wheel 24, as desired. In addition, any or all of the soft buttons described above in FIG. 4, or below, can comprise hard buttons on the housing 12 with associated displays. In the embodiment illustrated, display 87 provides labels for the buttons 18A and 18B organized as a set; however, individual displays can be provided for each of the buttons 18A and 18B, if desired. It should be also noted that any or all of the individual displays 85 and 87 can be integrated together in a larger display wherein portions thereof are associated with individual buttons or sets thereof.

Referring back to FIG. 1, the user can select an activity by using the rotating wheel 24 to highlight the desired activity. The user can then depress the wheel 24 to initiate the activity and proceed to the activity menu, such as illustrated in FIG. 4. Alternatively, the user can touch the descriptive identifier associated with the activity using a finger or a stylus. The touch-sensitive panel 33 (FIG. 2) responds to the pressure applied thereon to initiate the activity. It should be noted that in addition to displaying the appropriate activity menu selected, a sequence of commands can be associated with each activity and executed upon selection of the activity, if desired. For instance, in the component configuration of FIG. 3, selection of the activity "Watch TV" can cause the remote control unit 10 to transmit a first IR signal to the television 84 to automatically change to channel 3, and then transmit a second IR signal to the receiver 86 to select the VCR as an audio input. If desired, a soft button can be provided on activity screens to initiate command sequences. The command sequences can be stored in the memory 34 as "MACROS".

Figure 5:
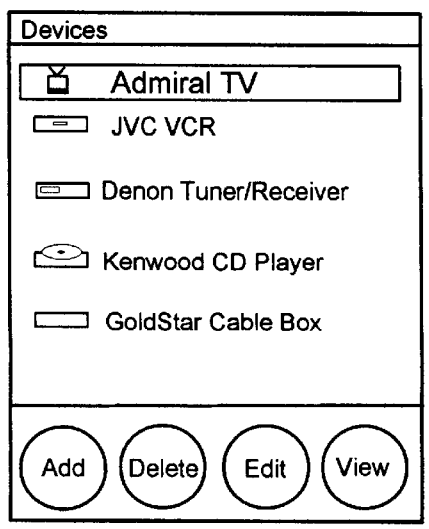
FIG. 5 is a screen display of a screen for device settings.

In addition to activity modes, the user can access individual controllable devices either separately displayed on the "Home Menu" or organized under a sub-menu "Devices", as illustrated in FIG. 5. The "Devices" sub-menu is similar to the "Home Menu", but provides a list of the controllable devices. The user can then navigate to one of the controllable devices by use of the wheel 24 or the touch-sensitive panel 33. Upon selection, the remote control unit 10 will display all of the buttons associated with the selected component.

Figure 6A:
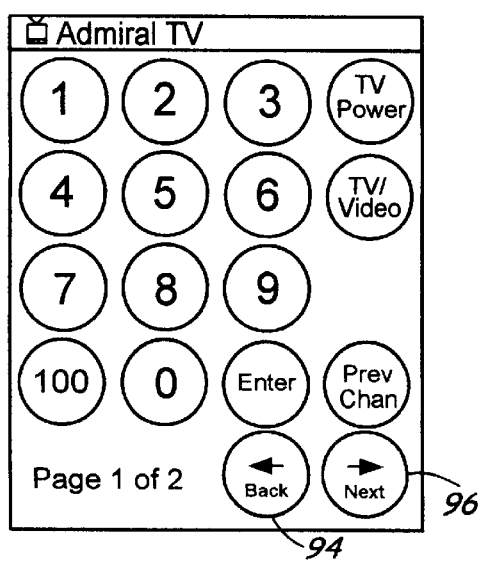
FIGS. 6A and 6B are screens for an exemplary device.
Figure 6B:
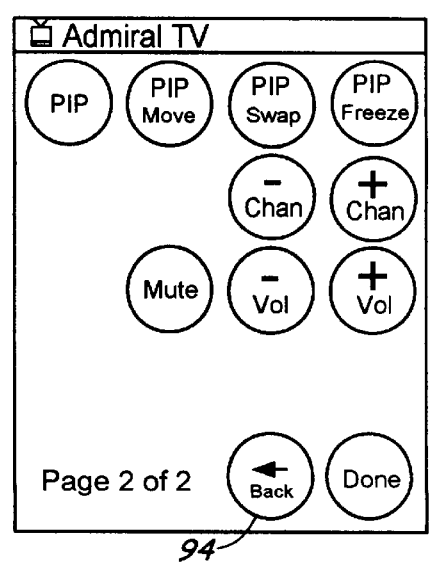

FIGS. 6A and 6B are exemplary screen displays for controlling a television. If, as illustrated in this example, a single screen display cannot display all of the buttons for the selected controllable device, (or an activity), multiple screens are used. Preferably, buttons used most often are displayed on the first component screen, such as illustrated in FIG. 6A, while buttons used less often are provided on subsequent screens. If multiple screens are needed, navigation buttons 94 and 96 are provided, and information as to the current page or screen being displayed is also provided.

Although not illustrated, it should be noted at this point that the shape of the soft buttons displayed on the display 16 can also be used advantageously to convey information to the user. For instance, soft buttons having a first shape (round) can be used to transmit a corresponding IR signal, while soft buttons having a second shape (rectangular with rounded corners) can be used for navigation. Other shapes can be used for other soft buttons. For example, a third shape of soft buttons can be used for stored command sequences also known as macros.

As indicated above, stored command sequences or macros can also be associated with soft buttons displayed on the display 16. Referring back to FIG. 4, a soft button 100 is particular useful. The button 100 is used to access another screen display herein denoted as "Favorites" and illustrated in FIG. 7B. The "Favorites" list allows the user to easily create and edit a list of channels that the user wants to access repeatedly. This form of television watching is commonly called "surfing". Preferably, the soft button 100 is provided on the activity screen "Watch TV", as illustrated in FIG. 4, by default. However, the soft button 100 can be also added to the "Component" screens (FIG. 6A or 6B), if desired.

Figure 7A:
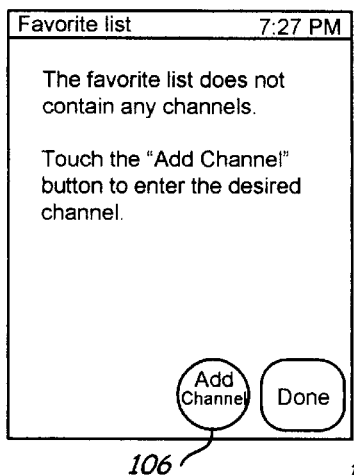
FIGS. 7A, 7B and 7C are screens for a favorite channel list.
Figure 7B:
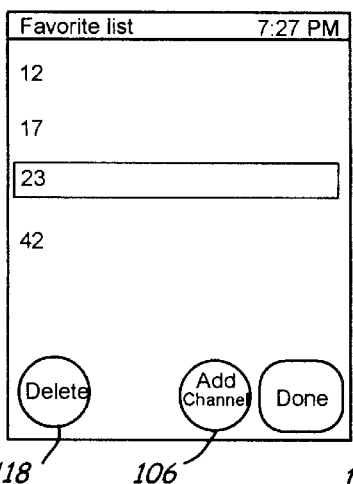
Figure 7C:
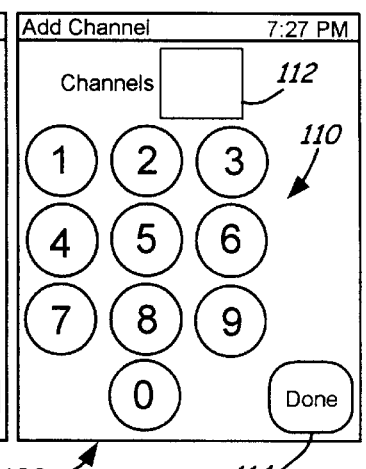

When the user presses the soft button 100, the remote control unit 10 displays either of the screens illustrated in FIGS. 7A or 7B. If there are no channels currently in the "Favorites" list, then a message is displayed prompting the user to add a channel as illustrated in FIG. 7A. If there is at least one channel in the list, then the current list is displayed as illustrated in FIG. 7B. From either of these screens, the user can add a new channel to the list. When the user activates a soft button 106, the remote control unit 10 displays a screen 108 illustrated in FIG. 7C. Screen 108 includes a numeric keypad 110 and an edit box 112. The user can add channels to the bottom of the "Favorites" list by touching the channel numbers on the keypad 110 and touching a soft button ("Done") 114. In one embodiment, a maximum number of channels can be added to the "Favorites" list. If the "Favorites" list already includes the maximum number of channels, the soft button 106 is disabled to prevent further additions. If desired, additional "editing" soft buttons can be provided on the screen 108 illustrated in FIG. 9. For instance, a "Clear" button can be provided to clear undesired entries in the edit box 112.

In operation, when channels are present in the "Favorites" list, the user can rotate the wheel 24 to highlight a particular channel. When the channel is highlighted, the remote control unit 10 transmits the IR code for the newly selected channel. If the highlight bar is on the top-most channel item, rotation of the wheel 24 up causes the highlight bar to go to the bottom-most channel in the list. Likewise, if the highlight bar is on the bottom-most channel, rotation of the wheel down causes the highlight bar to go to the top-most channel in the list. In this manner, the user can easily switch between all channels in the "Favorites" list. A soft button "delete" 118 is provided to selectively delete channels from the "Favorites" list.

Figures 8A, 8B:
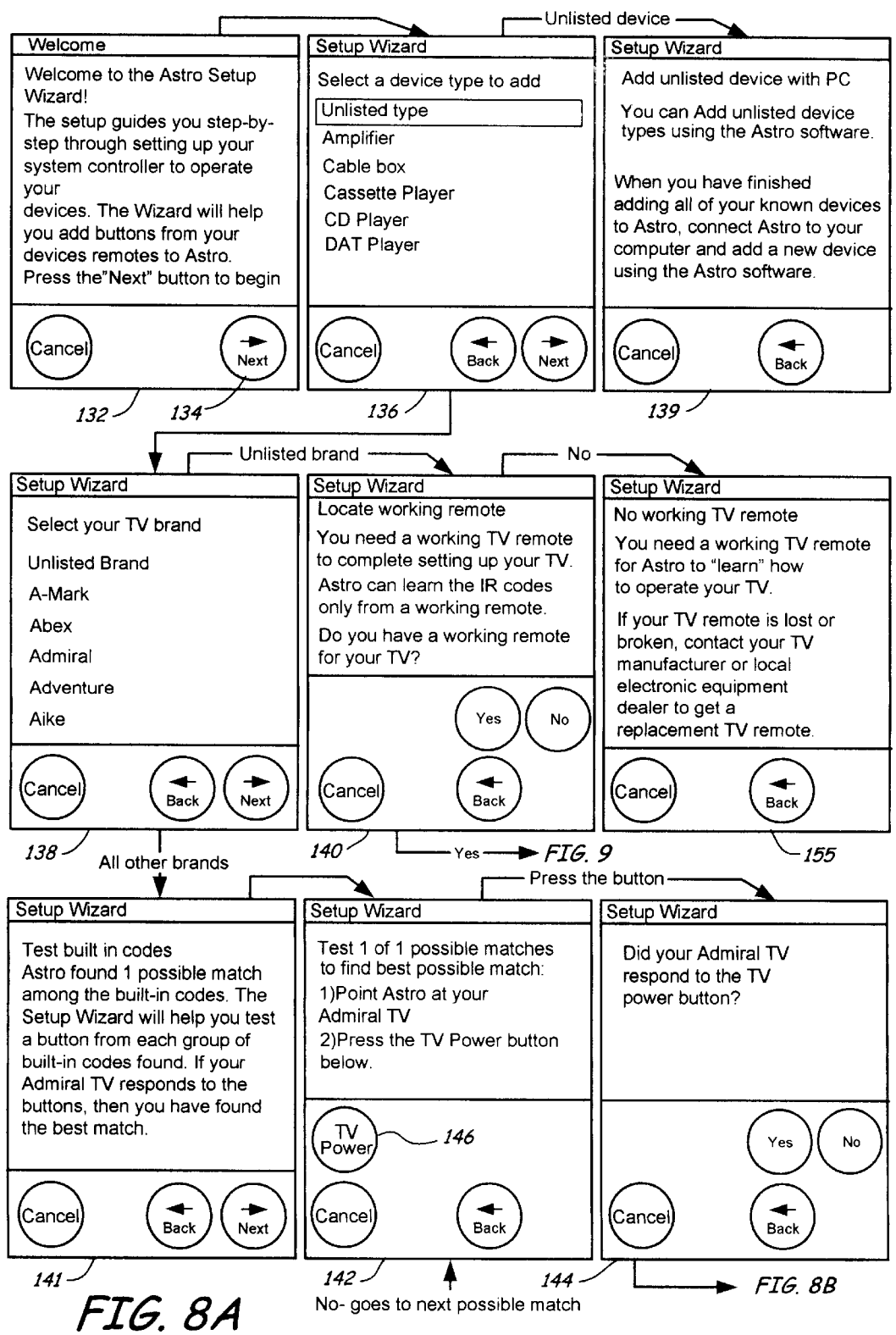
FIGS. 8A and 8B are a flow diagram, including screen displays, illustrating a setup method for the remote control unit.
Figure 8B:
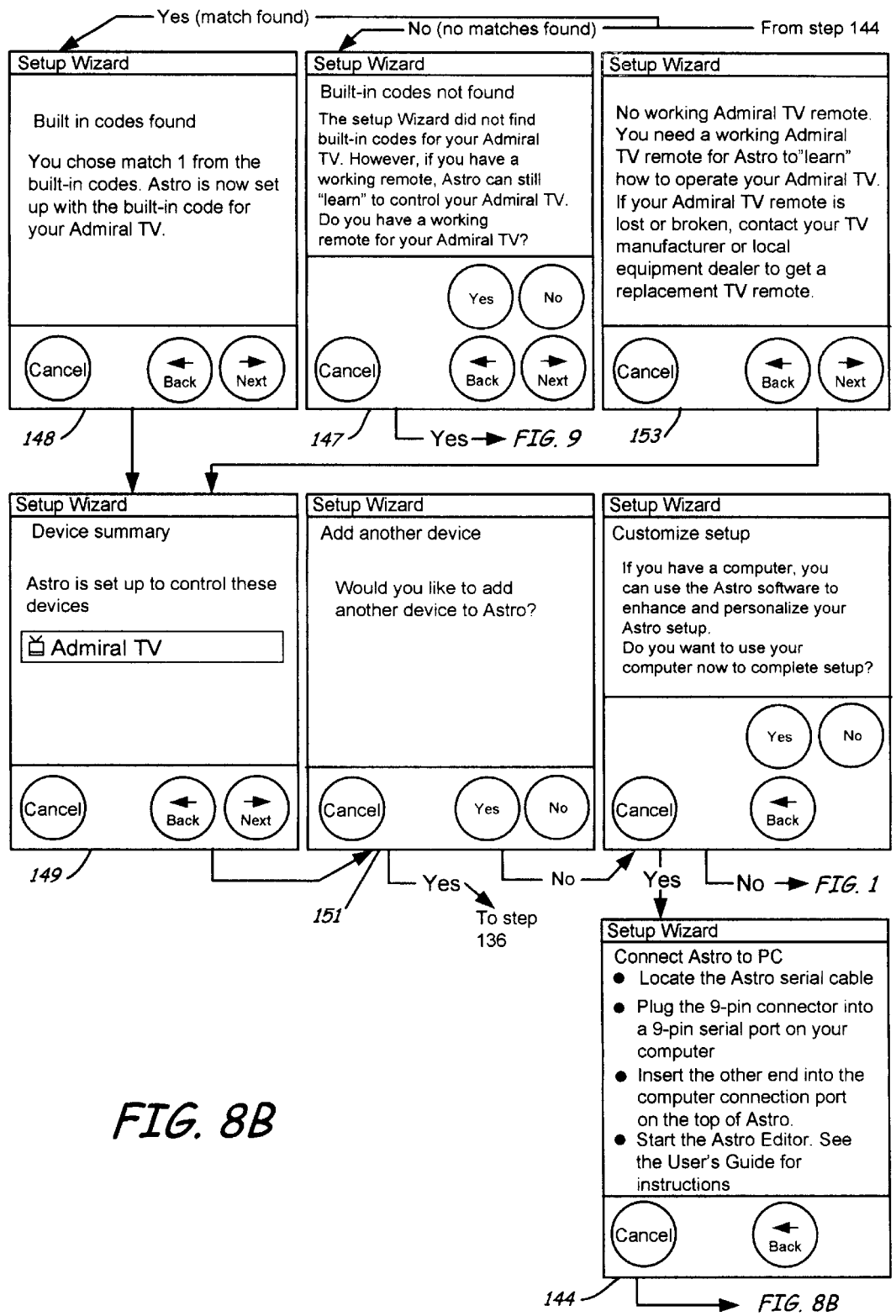

FIGS. 8A and 8B illustrate operation of a setup program module used to program the remote control unit 10 to operate each of the user's controllable devices. The method illustrated in FIGS. 8A and 8B include screens displayed on the display 16. Thus, in the embodiment illustrated, the remote control unit 10 can be programmed without coupling or interaction with another computer, such as the computer 60 illustrated in FIG. 2. However, as appreciated by those skilled in the art, initial programming of the remote control unit 10 can be performed on the computer 60 and then downloaded to the remote control unit 10 using the interface 62.

At step 132, the user is provided with an initial screen provided by a setup program module stored in the memory 34. The initial screen of step 132 can also remind the user to gather all the manufacturer remotes that the remote control unit 10 will replace. A soft button 134 is provided on the initial screen of step 132 to advance the user to step 136. Step 136 allows the user to select a component or controllable device that the remote control unit 10 will be programmed to operate. Using the wheel 24 or the touch-sensitive panel 33, the user can highlight and then select the first type of controllable device. In one embodiment, it should be noted that once the user has set up a particular controllable device or component, an indicator, such as a "check mark" can be displayed adjacent the component so that the user will know which components the remote control unit 10 has already been programmed for. If the user selects a component that already has a check mark associated with it, a suitable screen will be displayed, telling the user that he has already setup that type of component. The setup program module can then ask the user if the current setup should be deleted or replaced. If the user indicates that the setup should be replaced, a screen represented by step 138 will be displayed. Alternatively, the remote control unit 10 can be setup for multiple components of the same type, for example, two VCRs.

At step 136, the user selects the type of the controllable device. If the user cannot find a particular type of controllable device, an item in the list is "Unlisted Type". If the user selects this option, a screen 139 is displayed, telling the user that setup for this component can be performed using the computer 60.

Assuming a device is found at step 136, the user selects the brand of the controllable device at step 138. If the user cannot find a particular brand, an item in the list is "Unlisted Brand". If the user selects this option, setup can continue to step 140, wherein the user programs the remote control unit 10 using the manufacturer's remote. This will be discussed in greater detail below.

Once the type of component and brand have been determined in steps 136 and 138, the user is presented with a series of screens in order to identify the correct code set from the database of code sets 37 stored in the memory 34. Screens illustrated at steps 141, 142 and 144 are examples of this procedure. In particular, the remote control unit 10 accesses device code sets stored in the database to identify code sets corresponding to the type and brand determined in steps 136 and 138. If more than one code set exists, the correct code set is identified by asking a series of test questions. To identify the "best code set", i.e., the code set that the remote control unit 10 determines to be the most likely to be the code set that controls the controllable device, the remote control unit 10 examines the formats of commands within the various code sets to determine which commands within the various code sets are similar. When the remote control unit identifies dissimilarities between command formats, commands having dissimilar formats are tested to determine which command format is correct. In the exemplary screens of steps of 142 and 144, the power command is tested. However, a command other than the power command could be tested first.

To test the power command, the user activates the soft button 146 corresponding to the "test" option. Upon activation of the test option, the transmitter 38 of the remote control unit 10 transmits a power command to the controllable device. After the power command is tested, the remote control unit 10 queries the user in step 144 to provide feedback regarding the effect of the test. If the power command did not work, the user selects the "no" option and the screen of step 142 is again shown where the user is prompted to test another power command having a different command format from another code set.

However, if the power command worked, the user selects the "yes" option and the remote control unit 10 determines that the correct code set is one that includes a power command with a format similar to the format of the power command that worked. Therefore, the remote control unit 10 eliminates from the setup process any code set that includes a power command having a format that is dissimilar to the format of the power command that worked. This portion of the setup procedure is also described in co-pending application entitled "METHOD AND SYSTEM FOR PROGRAMMING A REMOTE CONTROL UNIT" (now U.S. Pat. No. 6,608,735) filed Feb. 3, 1997, and assigned Ser. No. 08/794,687, the content of which is hereby incorporated by reference in its entirety.

Various commands are tested as indicated above to identify the correct code set. If a code set is determined to be correct, program flow continues to step 148 whereat the user is informed that a code set has been ascertained. At step 149, a screen display is provided, indicating devices that have been programmed. At step 151, the user is queried if the remote should be programmed for another device. If a user chooses to setup another device, program flow continues back to step 136.

If the user's brand is unlisted in step 138 (FIG. 8A) or if a suitable code set was not. determined by trying various commands (step 147, FIG. 8B), the user is able to program the remote control unit 10 with the manufacturer's device specific remote. If the device specific remote is not available, a screen is displayed at steps 153 (FIG. 8A) and 155 (FIG. 8B), indicating a remote is necessary.

Figure 9:
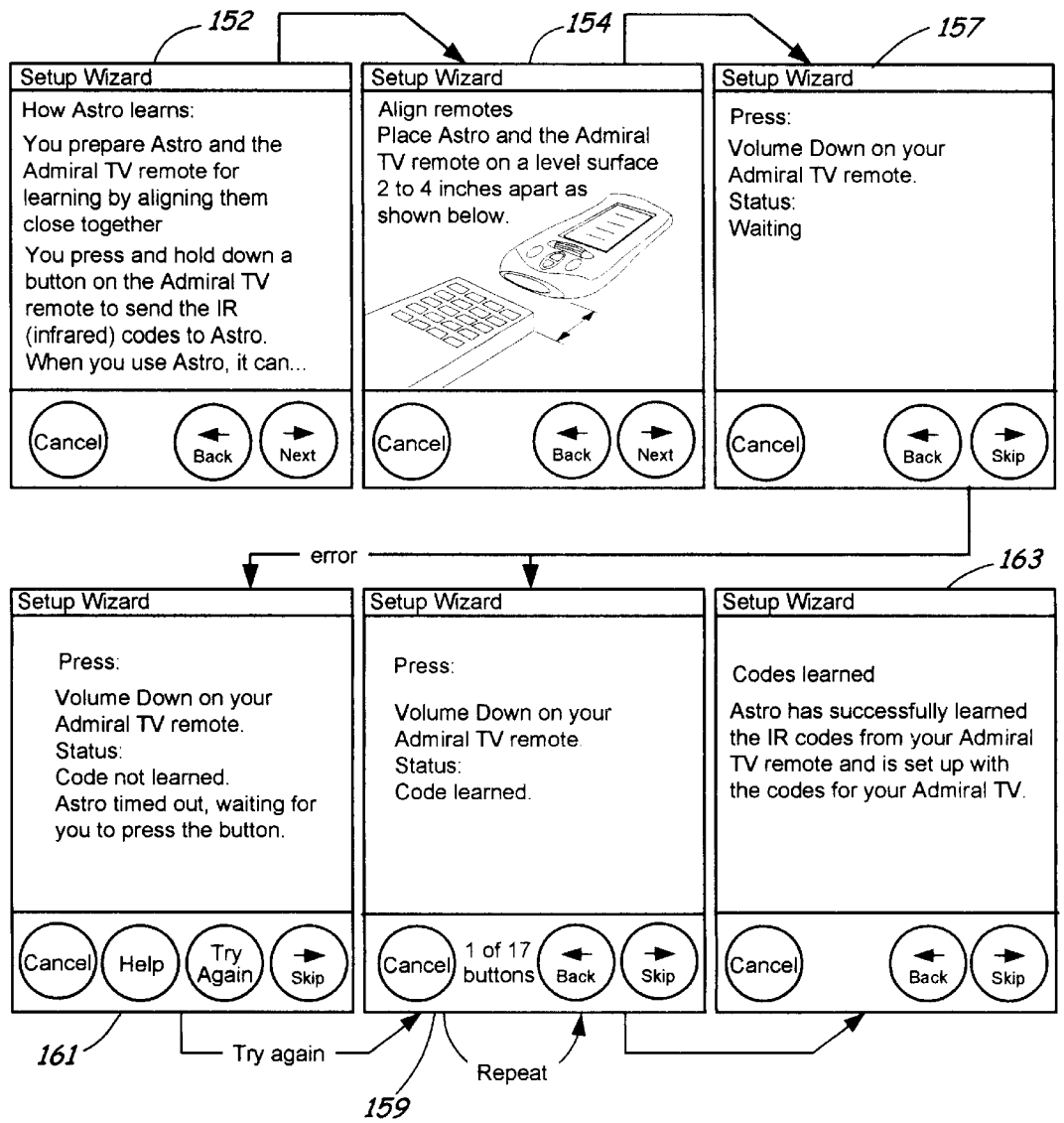
FIG. 9 is a method for programming the remote control unit with exemplary screen displays for learning a command.

Referring to FIG. 9, if the manufacturer's remote is available, program flow continues to step 152 whereat the user is informed as to the general programming procedure. At step 154, a screen is then displayed, instructing the user how to orient the remote control unit 10 and the manufacturer's device remote.

After step 154, successive screens are displayed that step the user through a learning process for a pre-defined set of buttons for the current component selected at step 138. FIG. 9 illustrates an example screen 157 wherein the user is asked to press the "Volume Down" button on the manufacturer's remote. If the remote control unit 10 receives the transmitted signal and is able to successfully learn the command, a screen 159 is displayed indicating that the command was successfully recorded. The screen will then automatically change to prompt for the next command from the manufacturer's remote. In the event that the remote control unit 10 does not receive the command signal (for example, within a preselected time period), a screen 161 will be displayed. At this point, the user may choose to skip the command or try the command again. The user may also initiate help from the remote control unit 10 to ascertain the problem. For example, the remote control unit 10 can instruct the user to re-align the remote controls because the signal obtained was weak. It should be noted that the user need not initiate help in order for the remote control unit 10 to provide necessary feedback to the user during programming. For example, in one embodiment, the remote control unit 10 can immediately display a message indicating that the first signal received was weak and that the user should check the alignment of the remotes before proceeding. A screen 163 is displayed when programming is complete.

Alternatively, if the user chooses to program the remote control unit 10 using the computer 60, the user can instruct the remote control unit 10 as to which buttons will be learned. The list of available buttons are provided on software that runs on the computer 60. Based on the component and the particular brand selected at steps 136 and 138, the computer 60 displays available buttons for programming. Alternatively, the user can instruct the computer 60 as to which buttons are available on the manufacturer's remote. The list of buttons for programming is compiled and the downloaded to the remote control unit 10. In a manner similar to screens 157, 159 and 161, the user is successfully prompted to press each of the buttons on the manufacturer's remote in order that the remote control unit can learn each of the command signals.

In an alternative embodiment, the list of buttons for learning can be stored on the remote control unit 10 in memory 34 organized as a function of buttons available for various types of controllable devices. In this manner, the setup program module can access the appropriate list of buttons, based on the information provided at step 136 and/or step 138, and sequentially prompt the user using the display 16 to depress the appropriate button on the source remote during the learning process. If the source remote does not include a particular button, the user can bypass the corresponding screen or wait for the remote control unit 10 to automatically proceed to the next button after a selected time period of waiting.

In a further embodiment, a list of available buttons or commands can be provided to the user using display 16. Using the touch sensitive panel 33, buttons 14 and/or wheel 24, the user can then select the commands which will be learned using the source remote. If desired, an editing program or module can be provided on the remote 10 and executed by the CPU 30 to edit a descriptive identifier for a command when it is displayed as a soft button. The editing module can receive input commands from the buttons 14 and wheel 24 for scrolling through characters, and/or from a soft keyboard provided on the touch sensitive panel 33.

In yet a further embodiment, the correct code set can be ascertained from the database of code sets 37 using the user's source remote. Referring back to FIG. 8A, once the type of component and brand have been determined in steps 136 and 138, the user is presented with a series of screens in order to identify the correct code set from the database of code sets 37 stored in memory 34. Although described above with respect to the previous programming methods, screens illustrated at steps 141, 154, and 157 are exemplary. In particular, the remote control unit 10 accesses device code sets stored in the database to identify code sets corresponding to the type and brand determined in steps 136 and 138. If more than one code set exists, the correct code set is identified by prompting the user to press buttons on the source remote, the IR command signals of which are received and examined by the remote control unit 10. The screen illustrated at step 154 instructs the user on how to align the source remote with the remote control unit 10. To identify the "best code set", i.e., the code set that the remote control unit 10 determines to be the most likely to be the code set that controls the controllable device, the remote control unit 10 examines the formats of commands within the various code sets to determine which commands within the various code sets are similar. When the remote control unit identifies dissimilarities between command formats, the remote control unit 10 prompts the user to press the button corresponding to the identified command on the source remote. The screen at step 157 is exemplary of this step. The receiver 52 (FIG. 2) receives the transmitted IR signal, which is subsequently decoded by decoder 54. The format of the decoded signal is then examined in order to determine which code set or sets of the group of code sets includes the transmitted command format. Therefore, the remote control unit 10 eliminates from the setup process any code set that has a dissimilar to the format of the transmitted command.

Various commands are tested to identify the correct code set. If a code set is determined to be correct, program flow continues to step 148 whereat the user is informed that a code set has been ascertained.

At this point, it should be noted that devices that have been programmed into the remote can be easily changed. Referring to FIG. 5, a "Delete" button is provided to remove a highlighted device. An "Add" button is also provided and allows the user to program the remote for another device using the method of FIGS. 8A and 8B. A "View" button allows the user to view settings, while an "Edit" button allows the user to make changes displaying those screens of FIGS. 8A and 8B as appropriate.

Figure 10:
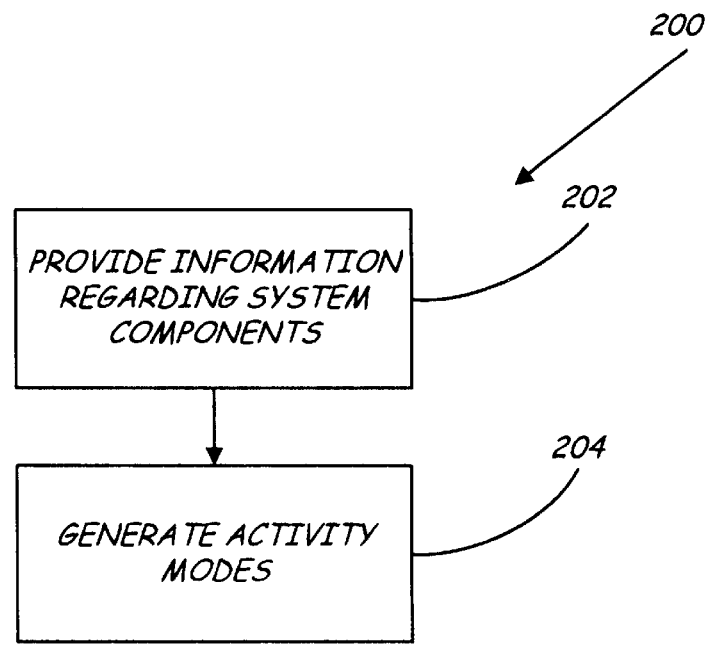
FIG. 10 is a flow diagram illustrating a setup method for the remote control unit.

FIG. 10 illustrates another aspect of the present invention which includes an exemplary method 200 for generating activity modes accessible on the remote control unit 10. Generally, the method 200 includes a step 202 for providing information regarding components of the system to be controlled by the remote control unit 10. This information was discussed above and includes the types, brands and/or models of each of the components to be controlled. The information regarding each of the components is preferably stored on the remote control unit 10 and is accessible during the activity mode setup procedure. Alternatively, such information can be stored on the remote computer 60 and is accessible to the remote control unit 10 using the interface 62.

At step 204, the remote control unit 10 generates activity modes. In one embodiment, the activity modes generated are based on the types of components comprising the user's particular system. For instance, the types of activity modes available can include "Watching TV", "Watching a Video Tape", "Watching a DVD (digital video disc)", "Watching a Laser Disc", "Recording a TV Show", "Listening to a Compact Disc" and/or "Listening to the Radio". Preferably, the remote control unit 10 will generate the activity modes that are only appropriate for the system. For instance, for a system comprising a television, a VCR and a radio or receiver, the activity modes that will be generated include "Watching TV", "Watching a Video Tape", "Recording a TV Show" and "Listening to the Radio", but will not include "Watching a DVD", "Watching a Laser Disc" or "Listening to a Compact Disc".

Figure 11:
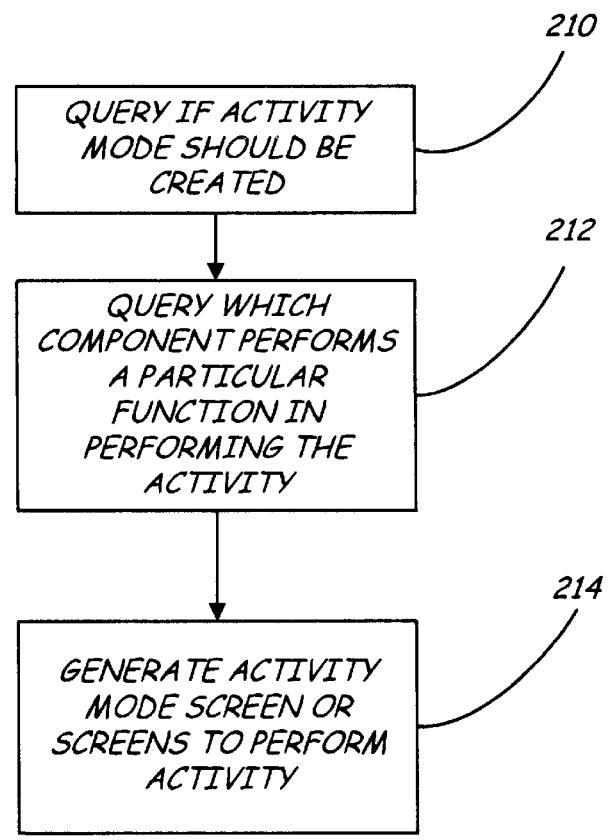
FIG. 11 is a flow diagram illustrating generation of activity mode screens.

FIG. 11 illustrates steps that can be included in step 204 of method 200. For each activity mode that can be generated based on the information provided in step 202, the user is queried at step 210 if a particular activity mode should be generated. At step 212, the user is then queried as to which component performs a particular function during the activity, particularly, if multiple components are capable of performing that function. For instance, if a system to be controlled by the remote control unit 10 includes a cable box converter, a television and a video cassette recorder, each of these components may be capable of changing a channel during the activity mode "Watching TV". At step 212, the user identifies which of the components will be used for changing a channel. In one embodiment, the user can be provided a list of components that are capable of changing the channel, and then the user selects which component will perform that function. It should be noted that the list can be generated based on the type of components the user is provided at step 202, and not on the specific capabilities of the brand or model of the component. For instance, the list of components can include a video cassette recorder, whether or not the user's video cassette recorder is capable of that function Alternatively, based on information gathered in step 202, the list of possible components to perform the function can be generated if that function is particularly available, either from the buttons specified by the user during the component setup screens, or based on the brand or model of the component.

Generally, step 212 solicits information from the user regarding operation of the controllable devices to perform an activity. In the embodiment described above, such information is obtained by querying the user as to which component performs a particular function. Alternatively, some of this information can be obtained by querying the user as to the connection of the components. For instance, if the setup program obtains information that the audio from the video cassette recorder is provided to the receiver, it may be assumable that the receiver will control the volume during the activity of "Watching a Video Tape".

At step 214, the remote control unit 10 generates an activity mode selection item for the "home page" (illustrated at FIG. 1), as well as an activity mode screen or screens having soft buttons necessary to perform the activity such as illustrated in FIG. 4. In addition, at step 214, the remote control unit stores information for mapping the keypad 14 and roller wheel 24 to control the necessary components to perform the activity.

It should be noted that in the embodiment illustrated, soft buttons are created using indicators generated on the display screen 16, wherein the indicators are associated with portions of the touch sensitive panel 33. However, in another embodiment, the indicators can be associated with hard buttons mounted on the housing 10, for example, located about the perimeter of the display screen 16, wherein the function of the hard buttons may vary from activity to activity.

Figure 12:
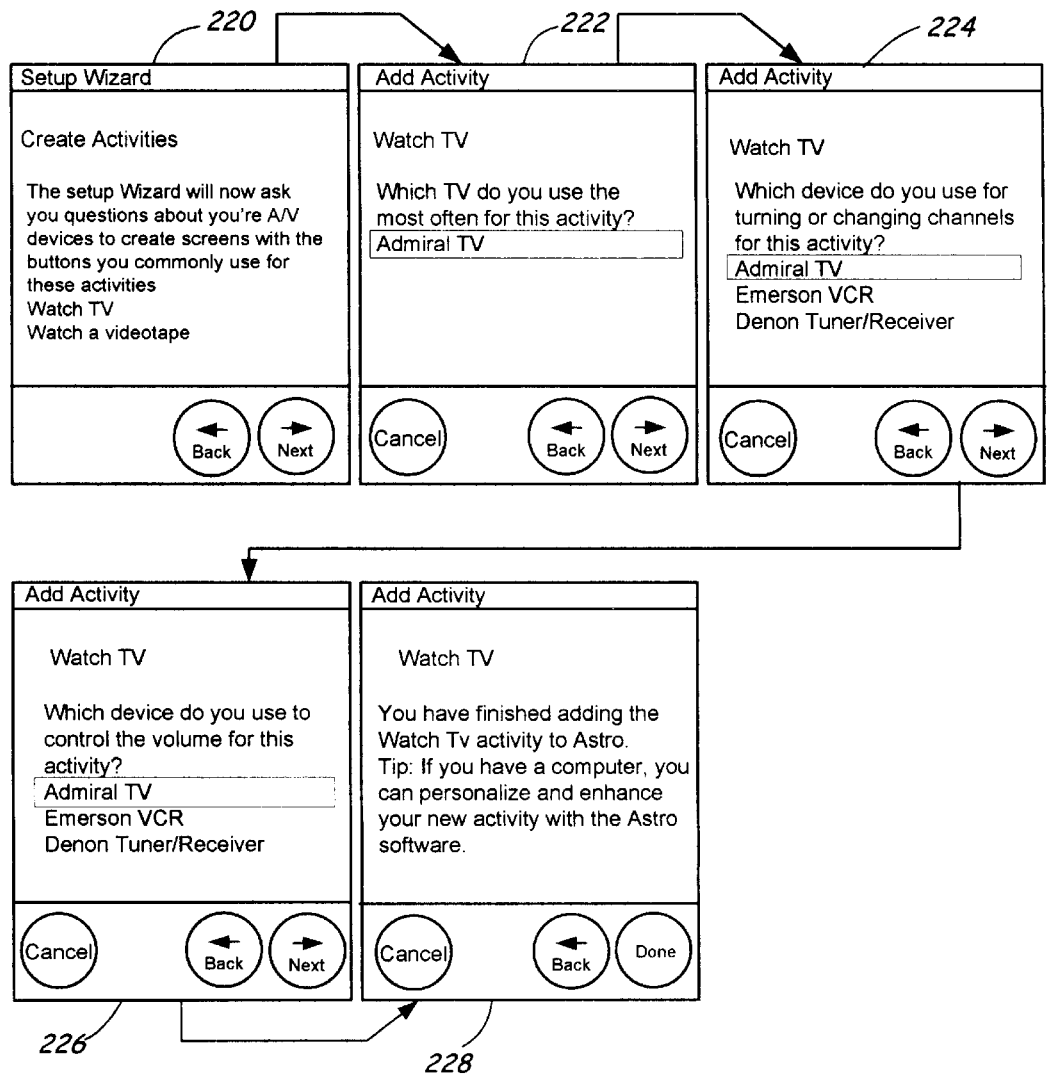
FIG. 12 are exemplary screen displays for the method of FIG. 11.

Operation of steps 210, 212 and 214 can also be explained through an example illustrated in FIG. 12. Using a screen 220, the user can be told which activities can be created or, alternatively, the user can select an activity to create. Assuming that the user desires the activity "Watch TV", at screen 222, the user is queried as to which TV, if more than one has been entered, will be used. At screen 224, the user is queried regarding which device will be used for changing the channel. In this embodiment, the list of possible components includes all devices that the user has previously configured. Using the rotating wheel 24 or the touch sensitive screen 33, the user selects which device will be used for changing the channel during the activity mode of "Watch TV". The user is then asked which device will be used to control the volume during this activity at screen 226. Screen 228 indicates that the activity has been programmed.

Referring back to FIG. 4, an exemplary screen generated by step 214 is illustrated for watching TV. The screen includes soft buttons "0–9" for the component which controls the channels while watching TV. In this embodiment, a soft button "100" plus" is also provided in view of the components selected because channels of 100 or above are possible. Other soft buttons can be generated on the activity mode screen as a function of the component selected. For instance, an "enter" button, a "recall" or "previous channel" button can also be provided if such buttons are available.

Note that this information was provided in step 202 of method 200 when the individual component was set up. A TV power button 91 is provided as well as other power buttons for components that are used to change channels or control the volume. If the user indicated that a video cassette recorder was used while watching TV, a "TV/Video" or "TV/VCR" soft button can also be provided. The "favorites" button 100, as discussed above, can also be automatically generated on the activity mode screen. If necessary, other screens can be automatically generated with buttons for other features of the particular activity. For instance, if the user's components are able to provide "surround sound", an additional screen may be necessary to provide the necessary control buttons. It should also be noted that if desired, the activity mode screens can be generated using stored preferences for soft button locations. For instance, each activity mode screen that includes power buttons for the components can always locate the power buttons on the highest row or upper-most portion of the screen in order to provide uniformity between the activity mode screens.

The above example describes the method for generating the activity mode for "Watch TV". As appreciated by those skilled in the art, other various activity modes can be created using a similar method. For example, activity modes such as "Watching A Video Tape", or "Listening to Compact Disc" can also be generated with suitable screens on the remote control unit 10. Furthermore, activity modes are not limited to entertainment equipment such as televisions, receivers, etc. but can also include other appliances and equipment that are controlled by remote control units. For instance, a specific activity mode screen can be generated to control the lights of a home, and such controls can be included in other activity mode screens such as "Watching TV".

Although the present invention has been described with reference to preferred embodiments, workers skilled in the art will recognize that changes may be made in form and detail without departing from the spirit and scope of the invention.

What is claimed is:

1. A remote control for controlling a plurality of controllable devices, the remote control comprising:

a processor;

a display screen coupled to the processor; and memory coupled to the processor, the memory including a program module to solicit information from a user regarding operation of the plurality of controllable devices and which controllable device performs a selected function during operation of an activity in order to provide a set of user programmed outputs to control the plurality of controllable devices to perform the activity.

2. The remote control of claim 1 wherein the program module generates a screen displayable on the display screen for the activity, the screen including indicators for controlling at least one of the plurality of controllable devices.

3. The remote control of claim 2 wherein the indicators include a first indicator associated with a first controllable device and a second indicator associated with a second controllable device.

4. The remote control of claim 3 wherein display screen includes a touch sensitive panel with portions associated with the indicators.

5. The remote control of claim 2 and further comprising a housing and buttons mounted on the housing and operatively coupled to the processor, and wherein the program module associates the buttons for controlling at least one of the plurality of controllable devices.

6. The remote control of claim 5 wherein the buttons include a first button associated with a first controllable device and a second button associated with a second controllable device.

7. The remote control of claim 1 wherein the information includes information about the connection of the controllable devices.

8. A computer-readable medium on which is stored a program module for operation on a remote control, the remote control controlling a plurality of controllable devices and having a processor coupled to a display screen, the program module comprising instructions which, when executed by the processor, perform the steps comprising:

soliciting information regarding operation of the plurality of controllable devices and which controllable device performs a selected function during operation of an activity in order to provide a set of user programmed outputs to control the plurality of controllable devices to perform the activity; and generating a screen displayable on the display screen for the activity, the screen including indicators for controlling at least one of the plurality of controllable devices.

9. The computer-readable medium of claim 8 wherein the instructions, the step of generating includes associating a first indicator with a first controllable device and associating a second indicator with a second controllable device.

10. The computer-readable medium of claim 9 wherein the instructions, which when executed by the processor, perform a step comprising:

associating portions of a touch sensitive panel with the indicators.

11. The computer-readable medium of claim 8 wherein the instructions, which when executed by the processor, perform a step comprising:

associating buttons mounted on a housing and operatively coupled to the processor with controlling at least one of the plurality of controllable devices.

12. The computer-readable medium of claim 11 wherein the step of associating includes a first button with a first controllable device and associating a second button with a second controllable device.

13. The computer-readable medium of claim 8 wherein the step of soliciting includes soliciting information about the connection of the controllable devices.

* * * * *